US012574013B2

(12) United States Patent
Saito et al.

(10) Patent No.: US 12,574,013 B2
(45) Date of Patent: Mar. 10, 2026

(54) COMPOSITE FILTER DEVICE

(71) Applicant: Murata Manufacturing Co., Ltd., Nagaokakyo (JP)

(72) Inventors: Michiaki Saito, Nagaokakyo (JP); Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 200 days.

(21) Appl. No.: 18/371,035

(22) Filed: Sep. 21, 2023

(65) Prior Publication Data

US 2024/0014806 A1     Jan. 11, 2024

Related U.S. Application Data

(63) Continuation of application No. PCT/JP2022/010063, filed on Mar. 8, 2022.

(30) Foreign Application Priority Data

Mar. 23, 2021     (JP) ................................. 2021-048941

(51) Int. Cl.
*H03H 9/64* (2006.01)
*H03H 7/46* (2006.01)
*H03H 9/72* (2006.01)

(52) U.S. Cl.
CPC ................ *H03H 9/64* (2013.01); *H03H 7/46* (2013.01); *H03H 9/72* (2013.01)

(58) Field of Classification Search
CPC .. H03H 9/64; H03H 7/46; H03H 9/72; H03H 9/0542; H03H 9/0547; H03H 9/6483; H03H 9/0085
See application file for complete search history.

(56) References Cited

U.S. PATENT DOCUMENTS

| | | | |
|---|---|---|---|
| 5,510,758 A | 4/1996 | Fujita et al. | |
| 7,619,491 B2 * | 11/2009 | Takata | H03H 9/725 |
| | | | 333/133 |
| 9,130,540 B2 * | 9/2015 | Nagai | H03H 9/70 |
| 9,595,938 B2 * | 3/2017 | Yasuda | H03H 7/461 |
| 2012/0235767 A1 | 9/2012 | Takata et al. | |
| 2013/0222077 A1 * | 8/2013 | Ota | H03H 9/64 |
| | | | 333/195 |

(Continued)

FOREIGN PATENT DOCUMENTS

| | | |
|---|---|---|
| JP | 0774285 A | 3/1995 |
| JP | 2018133800 A | 8/2018 |

(Continued)

OTHER PUBLICATIONS

International Search Report in PCT/JP2022/010063, mailed May 17, 2022, 3 pages.

(Continued)

*Primary Examiner* — John W Poos
(74) *Attorney, Agent, or Firm* — Keating & Bennett, LLP

(57) ABSTRACT

A composite filter device includes first and second filter chips mounted on an upper surface of a substrate by first and second conductive bonds. The first filter chip includes a longitudinally coupled resonator filter. The second filter chip does not include a longitudinally coupled resonator filter. A height of the first conductive bond is lower than a height of the second conductive bond.

20 Claims, 4 Drawing Sheets

(56)            References Cited

U.S. PATENT DOCUMENTS

2016/0142040  A1      5/2016  Yasuda
2017/0092621  A1*    3/2017  Das .................. H01L 23/53238
2018/0234079  A1      8/2018  Takamine et al.

FOREIGN PATENT DOCUMENTS

WO          2011077773  A1      6/2011
WO          2012046481  A1      4/2012
WO          2015016203  A1      2/2015

OTHER PUBLICATIONS

Written Opinion in PCT/JP2022/010063, mailed May 17, 2022, 4
pages.

* cited by examiner

COMPOSITE FILTER DEVICE

CROSS REFERENCE TO RELATED APPLICATIONS

This application claims the benefit of priority to Japanese Patent Application No. 2021-048941 filed on Mar. 23, 2021 and is a Continuation Application of PCT Application No. PCT/JP2022/010063 filed on Mar. 8, 2022. The entire contents of each application are hereby incorporated herein by reference.

BACKGROUND OF THE INVENTION

1. Field of the Invention

The present invention relates to a composite filter device in which a plurality filter chips are mounted on a common substrate.

2. Description of the Related Art

Conventionally, a composite filter device is used in an RF stage of a smartphone or the like. In a composite filter device described in International Publication No. 2011/077773, ends of a transmission filter and a reception filter are commonly connected to an antenna terminal. The transmission filter is a ladder filter including a plurality of acoustic wave resonators. The reception filter includes a longitudinally coupled resonator filter. In this composite filter device, a filter chip included in the transmission filter and a filter chip included in the reception filter are mounted on a common substrate by using bumps.

SUMMARY OF THE INVENTION

When a plurality of filter chips are mounted on a common substrate, heights of bumps are made to be the same since manufacturing is easier. Therefore, values of parasitic inductances caused between the respective filter chips and a ground potential are substantially uniform.

However, appropriate inductance values vary depending on internal circuits of the filter chips. Therefore, attenuation characteristics in filter characteristics may degrade in a certain filter chip.

Preferred embodiments of the present invention provide composite filter devices in each of which attenuation characteristics of a plurality of filter chips are unlikely to degrade.

A composite filter device according to a preferred embodiment of the present invention includes a substrate including a first principal surface, a first filter chip including a first conductive bond and mounted on the first principal surface of the substrate by the first conductive bond, and a second filter chip including a second conductive bond and mounted on the first principal surface of the substrate by the second conductive bond. The first filter chip includes a longitudinally coupled resonator filter. The second filter chip does not include a longitudinally coupled resonator filter. A height of the first conductive bond is lower than a height of the second conductive bond.

According to preferred embodiments of the present invention, composite filter devices in which attenuation characteristics of the first and second filter chips are unlikely to degrade are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is clarified below through description of concrete preferred embodiments of the present invention with reference to the drawings.

It is noted that each preferred embodiment described herein is merely illustration, and partial replacement or combination of components between different preferred embodiments is possible.

Figure 1:
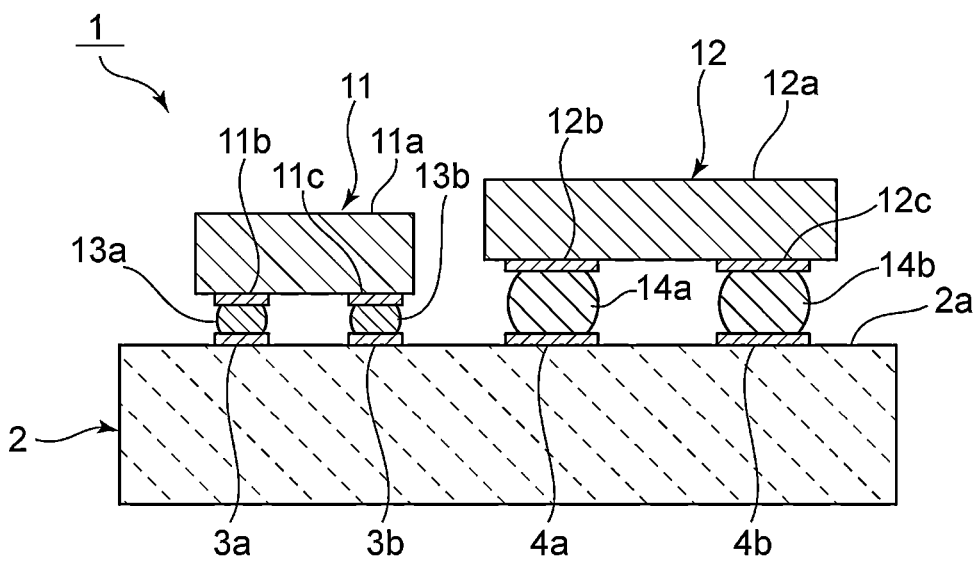
FIG. 1 is a front sectional view of a composite filter device according to a first preferred embodiment of the present invention.
Figure 2:
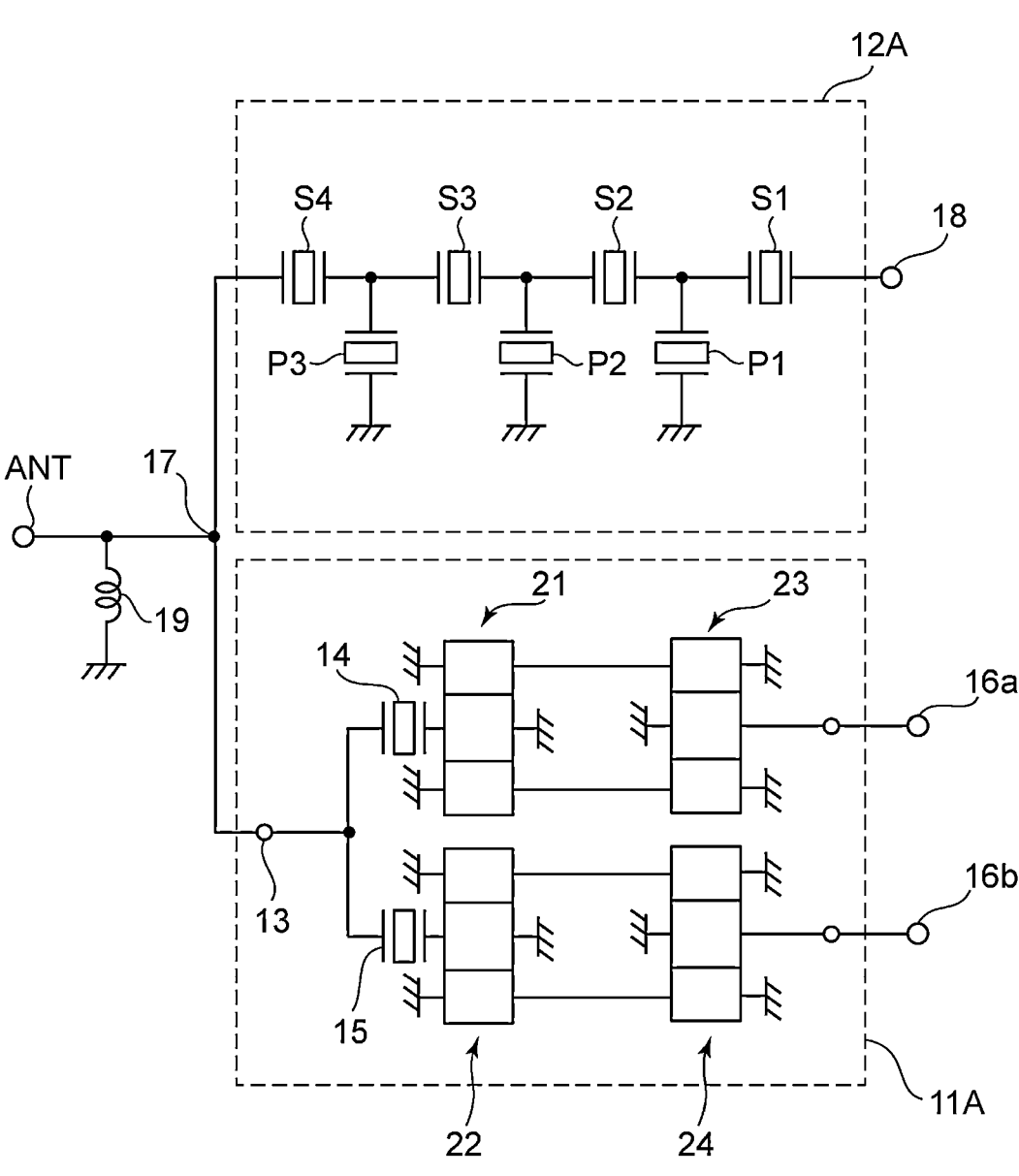
FIG. 2 is a circuit diagram of the composite filter device according to the first preferred embodiment of the present invention.

FIG. 1 is a front sectional view of a composite filter device according to a first preferred embodiment of the present invention, and FIG. 2 is a circuit diagram of the composite filter device.

A composite filter device 1 includes a substrate 2. The substrate 2 includes an upper surface 2a as a first principal surface, on which first and second filter chips 11 and 12 are mounted.

An internal circuit of the first filter chip 11 includes a longitudinally coupled resonator filter 11A illustrated in FIG. 2. An internal circuit of the second filter chip 12 includes a ladder filter 12A as an acoustic wave filter illustrated in FIG. 2.

That is, the composite filter device 1 includes the longitudinally coupled resonator filter 11A and the ladder filter 12A whose one ends are commonly connected to an antenna terminal ANT illustrated in FIG. 2. The longitudinally coupled resonator filter 11A is a reception filter. The ladder filter 12A is a transmission filter.

As illustrated in FIG. 1, electrode lands 3a, 3b, 4a, and 4b for mounting are provided to the upper surface 2a of the substrate 2. The first filter chip 11 includes a chip body 11a, and electrode pads 11b and 11c provided to a lower surface of the chip body 11a. The electrode pads 11b and 11c are bonded to the electrode lands 3a and 3b with first bumps 13a and 13b interposed therebetween, respectively. The first bumps 13a and 13b are made of solder or metal such as Au.

The second filter chip 12 includes a chip body 12a, and electrode pads 12b and 12c provided to a lower surface of the chip body 12a. The electrode pads 12b and 12c are bonded to the electrode lands 4a and 4b with second bumps 14a and 14b interposed therebetween, respectively. The second bumps 14a and 14b are also made of solder or metal such as Au.

Note that in this preferred embodiment the first bumps 13a and 13b are used as a first conductive bonding member. Moreover, the second bumps 14a and 14b are used as a second conductive bonding member. The conductive bonding member is made of conductive material, and is a material disposed between the filter chip and the substrate upper surface and bonding the filter chip to the substrate while electrically connecting therebetween. Such a conductive bonding member is not limited to a bump, but may be a bonding member made of conductive material other than a bump.

In the composite filter device 1, a height of the first bumps 13a and 13b is lower than a height of the second bumps 14a and 14b. Therefore, attenuation characteristics in the first filter chip 11 can be improved, and also attenuation characteristics in the second filter chip 12 can be improved. This is because of the following reasons.

The internal circuit of the first filter chip 11 is the longitudinally coupled resonator filter 11A. In the longitudinally coupled resonator filter 11A, attenuation characteristics degrade when a parasitic inductance which is caused between the longitudinally coupled resonator filter 11A and a ground potential is large. Therefore, the height of the first bumps 13a and 13b is preferably low. Thus, degradation of the attenuation characteristics in the first filter chip 11 can be reduced or prevented.

On the other hand, the internal circuit of the second filter chip 12 does not include a longitudinally coupled resonator filter, but includes the ladder filter 12A. In the ladder filter 12A, by a value of a parasitic inductance which is added between the ladder filter 12A and the ground potential being adjusted, attenuation characteristics can be improved. That is, in order to improve the attenuation characteristics, an inductance at an appropriate value is desired to be added between the ladder filter 12A and the ground potential.

In the composite filter device 1, since the height of the second bumps 14a and 14b is relatively high, the attenuation characteristics can be improved by utilizing the inductance attributed to the second bumps 14a and 14b. Therefore, also in terms of the second filter chip 12, the attenuation characteristics can be improved.

Moreover, in the ladder filter 12A, in order to secure the inductance which is added between the ladder filter 12A and the ground potential, there is a case in which an inductance element is provided to the substrate 2 or inductance attributed to wiring is utilized. Also in such a case, since the inductance attributed to the second bumps 14a and 14b can be utilized, an inductance adding portion included in the substrate 2 can be made smaller. Thus, size reduction can also be achieved.

Note that material of the substrate 2 and material of the electrode lands 3a, 3b, 4a, and 4b are not particularly limited. As the substrate 2, for example, a suitable insulator or semiconductor may be used. Regarding the electrode lands 3a, 3b, 4a, and 4b, suitable metal or alloy may be used.

The electrode pads 11b, 11c, 12b, and 12c of the first and second filter chips 11 and 12 also may be formed of suitable metal or alloy.

Moreover, as illustrated in FIG. 2, in the longitudinally coupled resonator filter 11A, resonators 14 and 15 are connected, in parallel, to a terminal 13 which is connected to the antenna terminal ANT. Furthermore, longitudinally coupled resonator filters 21 and 23 are cascade-connected between the resonator 14 and one reception terminal 16a.

Similarly, longitudinally coupled resonator filters 22 and 24 are cascade-connected between the resonator 15 and the other reception terminal 16b.

Note that the internal circuit of the first filter chip including the longitudinally coupled resonator filter is not limited to this. That is, a suitable internal circuit having a longitudinally coupled resonator filter may be used.

The ladder filter 12A includes a series arm connecting a common terminal 17 to a transmission terminal 18. The series arm is provided with series arm resonators S1 to S4. Moreover, first to third parallel arms connecting the series arm to the ground potential are provided with first to third parallel arm resonators P1 to P3, respectively. The series arm resonators S1 to S4 and the parallel arm resonators P1 to P3 are each defined by an acoustic wave resonator (SAW resonator). Therefore, the ladder filter 12A is a SAW filter. Note that in the present invention, the circuit configuration of the ladder filter 12A is also not limited to this example.

Note that in FIG. 2, an inductor 19 is provided for impedance matching.

As illustrated in FIG. 1, in the composite filter device 1, the first filter chip 11 is disposed at a side of the second filter chip 12.

Figure 3:
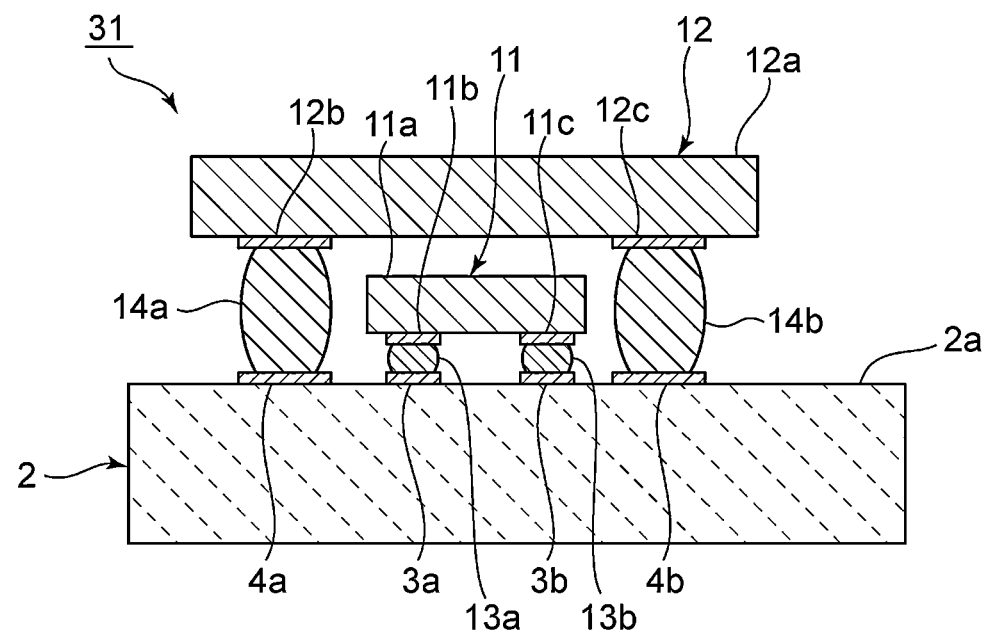
FIG. 3 is a front sectional view of a composite filter device according to a second preferred embodiment of the present invention.

FIG. 3 is a front sectional view of a composite filter device according to a second preferred embodiment of the present invention. In a composite filter device 31 of the second preferred embodiment, the first filter chip 11 is mounted between the lower surface of the chip body 12a of the second filter chip 12 and the upper surface 2a of the substrate 2. That is, the first filter chip 11 is mounted on the substrate 2 in a space sandwiched between the second bumps 14a and 14b. Therefore, it is unnecessary that the first filter chip 11 is disposed at the side of the second filter chip 12. Thus, the composite filter device 31 can reduce its plane area. The other configurations of the composite filter device 31 are similar to the composite filter device 1. Therefore, description thereof is omitted by giving the same reference characters to the same parts.

Also in the composite filter device 31, the height of the first bumps 13a and 13b is lower than the height of the second bumps 14a and 14b. Therefore, also in the composite filter device 31, the attenuation characteristics in the first and second filter chips 11 and 12 are unlikely to degrade.

Note that in the composite filter device 31 the first filter chip 11 is disposed in the space below the second filter chip 12. In this case, however, it is unnecessary that the entire first filter chip 11 is disposed in the space below the second filter chip 12. That is, only a portion of the first filter chip 11 may be located in the space below the second filter chip 12.

Figure 4:
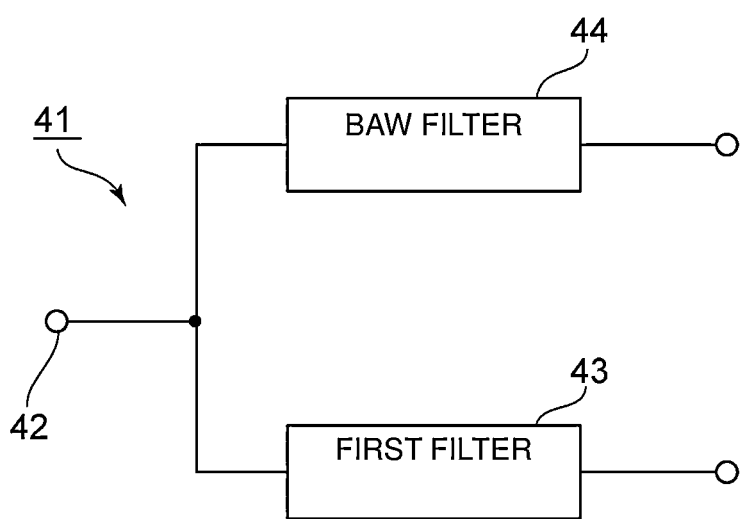
FIG. 4 is a circuit diagram of a composite filter device according to a third preferred embodiment of the present invention.

FIG. 4 is a circuit diagram of a composite filter device according to a third preferred embodiment of the present invention. In a composite filter device 41, one end of a first filter 43 and one end of a BAW filter 44 as a second filter is commonly connected to a common terminal 42. As described above, the second filter is not limited to a SAW filter, but may be the BAW filter 44.

Figure 5:
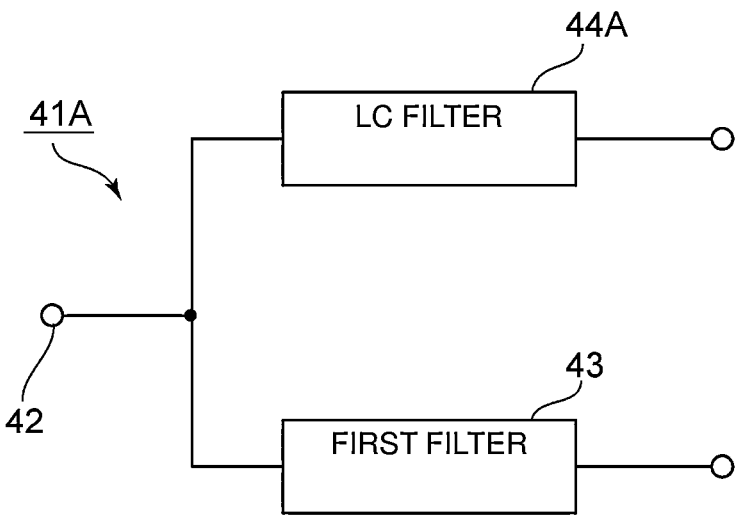
FIG. 5 is a circuit diagram of a composite filter device according to a fourth preferred embodiment of the present invention.

FIG. 5 is a circuit diagram of a composite filter device according to a fourth preferred embodiment of the present invention. In a composite filter device 41A, an LC filter 44A is used as the second filter. The other configurations are similar to the composite filter device 41 of the third preferred embodiment. As described above, the second filter is not limited to an acoustic wave filter, but may be an LC filter.

Figure 6:
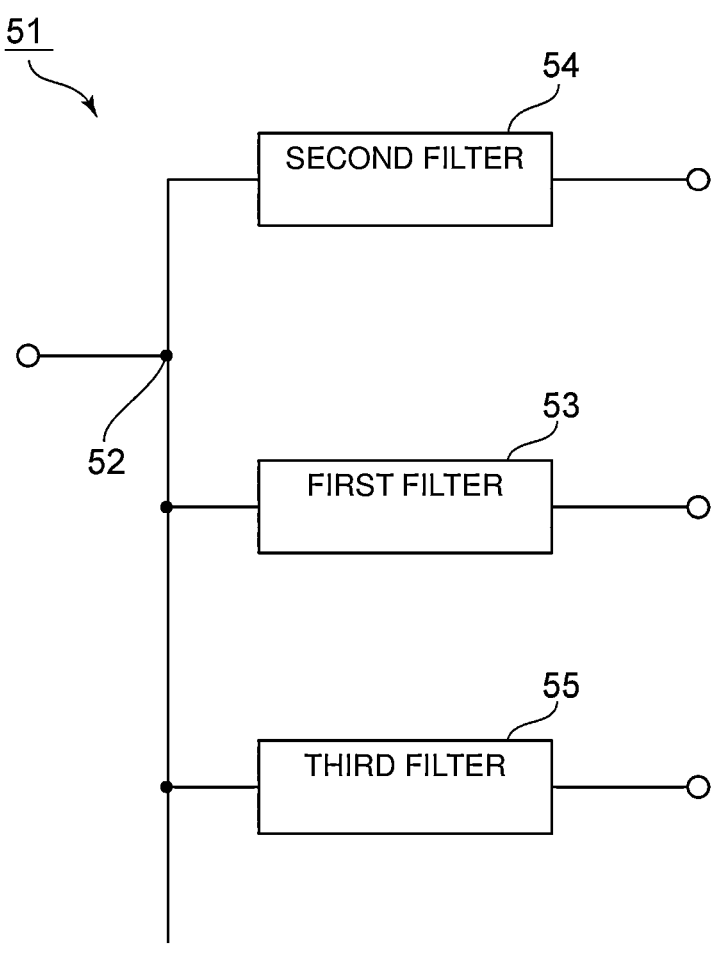
FIG. 6 is a circuit diagram of a composite filter device according to a fifth preferred embodiment of the present invention.

FIG. 6 is a circuit diagram of a composite filter device according to a fifth preferred embodiment of the present invention. In a composite filter device 51, one ends of a first filter 53, a second filter 54, and a third filter 55 are connected to a common terminal 52. Note that, like the composite filter device 51, three or more filter chips may be connected to the common terminal 52. In this case, the first filter 53 includes the longitudinally coupled resonator filter similarly to the first and second preferred embodiments. The second filter 54 may be an acoustic wave filter, such as the ladder filter, or an LC filter as described above. The third filter 55 also may be configured by another suitable band pass filter not including a longitudinally coupled resonator filter, similarly to the second filter 54.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
a substrate including a first principal surface;
a first filter chip including a first conductive bond and mounted on the first principal surface of the substrate by the first conductive bond; and
a second filter chip including a second conductive bond and mounted on the first principal surface of the substrate by the second conductive bond; wherein
the first filter chip includes a longitudinally coupled resonator filter;
the second filter chip does not include a longitudinally coupled resonator filter; and
a height of the first conductive bond is lower than a height of the second conductive bond.

2. The composite filter device according to claim 1, wherein the first filter chip is mounted on the first principal surface of the substrate between the first principal surface of the substrate and the second filter chip.

3. The composite filter device according to claim 1, wherein each of the first conductive bond and the second conductive bond is a bump.

4. The composite filter device according to claim 1, wherein the second filter chip includes an acoustic wave filter.

5. The composite filter device according to claim 4, wherein the acoustic wave filter is a ladder filter.

6. The composite filter device according to claim 4, wherein the acoustic wave filter is a SAW filter.

7. The composite filter device according to claim 1, wherein the second filter chip includes an LC filter.

8. The composite filter device according to claim 1, wherein the first filter chip includes a reception filter and the second filter chip includes a transmission filter.

9. The composite filter device according to claim 1, wherein each of the first conductive bond and the second conductive bond include solder or a metal.

10. The composite filter device according to claim 1, wherein each of the first conductive bond and the second conductive bond include Au.

11. The composite filter device according to claim 1, wherein the substrate includes an insulator or a semiconductor.

12. The composite filter device according to claim 1, wherein the longitudinally coupled resonator filter includes resonators connected in parallel to a terminal.

13. The composite filter device according to claim 1, wherein the longitudinally coupled resonator filter includes first longitudinally coupled resonator filters cascade-connected between a first resonator and a first reception terminal and second longitudinally coupled resonator filters cascade-connected between a second resonator and a second reception terminal.

14. The composite filter device according to claim 1, wherein the ladder filter includes a series arm connecting a common terminal to a transmission terminal.

15. The composite filter device according to claim 14, wherein the series arm includes series arm resonators defined by acoustic wave resonators.

16. The composite filter device according to claim 15, further comprising parallel arm resonators connecting the series arm to a ground potential and including acoustic wave resonators.

17. The composite filter device according to claim 1, further comprising an inductor to perform impedance matching.

18. The composite filter device according to claim 1, wherein the first filter chip is located at a side of the second filter chip.

19. The composite filter device according to claim 1, wherein the first filter chip is mounted between a lower surface of the second filter chip and an upper surface of the substrate.

20. The composite filter device according to claim 1, wherein only a portion of the first filter chip is located in a space below the second filter chip.

* * * * *